US006486654B1

United States Patent
Hug et al.

(10) Patent No.: US 6,486,654 B1
(45) Date of Patent: Nov. 26, 2002

(54) CALIBRATION OF MAGNETIC FORCE OR SCANNING HALL PROBE MICROSCOPES BY MEASURING SAMPLE IMAGES AND CALCULATING INSTRUMENT RESPONSE FUNCTIONS

(75) Inventors: Hans Josef Hug, Basel; Petrus Johannes Antonius Van Schendel, Dornach, both of (CH)

(73) Assignee: Triple-O Microscopy GmbH, Potsdam (DE)

(*) Notice: Subject to any disclaimer, the term of this patent is extended or adjusted under 35 U.S.C. 154(b) by 0 days.

(21) Appl. No.: 09/562,558

(22) Filed: May 2, 2000

(30) Foreign Application Priority Data

May 4, 1999 (EP) .............................................. 99810381

(51) Int. Cl.$^7$ ......................... G01R 35/00; G01R 33/02
(52) U.S. Cl. ....................................... 324/202; 324/244
(58) Field of Search ............................... 324/202, 207.2, 324/244, 251, 260, 235, 239, 262

(56) References Cited

U.S. PATENT DOCUMENTS 5,825,670 A    10/1998   Chernoff et al. ........ 364/571.02

OTHER PUBLICATIONS

Zhu, J.–G., et al., "Magnetic force microscopy image restoration technique for removing tip dependence," *Journal of Applied Physics*, vol. 83, No. 11, Jan. 1998, pp. 6223–6225.
Oral, A., et al., "Real–time scanning Hall probe microscopy," *Applied Physics Letters, US,* American Institute of Physics, N.Y., vol. 69, No. 9, Aug. 26, 1996, pp. 1324–1326.

Hug, H., et al., "Quantitative magnetic force microscopy on perpendicularly magnetized samples," *Journal of Applied Physics*, vol. 83, No. 11, Jun. 1, 1998, pp. 5609–5620.

McVitie, S., et al., "Absolute field strength determination of magnetic force microscope tip stray fields," Proceedings of the Institute of Physics . . . , Bristol, UK, 1997, pp.; 201–204.

Vellekoop, S., et al., "Calculation of playback signals for MFM images using transfer functions," *Journal of Magnetism and Magnetic Materials,* vol. 193, No. 1–3, Mar. 1999, pp. 474–478.

*Primary Examiner*—Jay Patidar
(74) *Attorney, Agent, or Firm*—Ladas & Parry

(57) ABSTRACT

A method for calibrating magnetic force microscopes (MFM) or scanning Hall probe microscopes (SHPM) is disclosed, wherein an instrument response function IRF is determined for correcting arbitrary raw MFM- or SHPM-images $S_i$. According to one aspect of the invention a sample with an irregular magnetization pattern M over an extended area is provided, a raw MFM- or SHPM-image S is measured, an approximate sample magnetization pattern $M_0$ and therefrom an approximate magnetic stray field distribution $H_0$ are determined and an instrument response function IRF is calculated using the raw MFM- or SHPM-image S and the approximate magnetic stray field distribution $H_0$. Other aspects of the calibration method consist in that the instrument response function IRF is calculated in Fourier space as $IRF(\underline{k})=S(\underline{k})H_0(\underline{k})$ and/or that averages or iterative calculations of instrument response functions $IRF_j$ (j=1 . . . m) are performed. Preferably a tip calibration function $q_{tip}(\underline{k})$, characterizing the magnetic stray field distribution of the tip of a magnetic force microscope (MFM), is derived from the IRF by eliminating cantilever effects caused by tilt and mechanical properties of the cantilever.

25 Claims, 1 Drawing Sheet

CALIBRATION OF MAGNETIC FORCE OR SCANNING HALL PROBE MICROSCOPES BY MEASURING SAMPLE IMAGES AND CALCULATING INSTRUMENT RESPONSE FUNCTIONS

CROSS REFERENCE TO RELATED APPLICATION

This application claims the priority of the European patent application No. 99 810 381.6, filed on May 4, 1999, the disclosure of which is incorporated herein by reference in its entirety.

BACKGROUND OF THE INVENTION

The invention refers to the field of magnetic force or Hall probe microscopy. It is based on a method for calibrating a magnetic force microscope (MFM) or a scanning Hall probe microscope (SHPM), wherein a raw MFM- oder SHPM-image S is measured by scanning a sample with a microscopic tip and an instrument response function IRF is determined for calibrating the MFM or SHPM.

The invention relates to a state of the art as presented in the article of J.-G. Zhu et al., "Magnetic force microscopy image restoration technique for removing tip dependence", Journal of Applied Physics Vol. 83 (11), p. 6223–6225 (1998). It is proposed to use samples that approximate a point source of magnetic field, i. e. a magnetic monopole or dipole, in order to determine an impulse response function of the magnetic force microscope (MFM) tip. The impulse response function is then used to deconvolve raw MFM-images in the Fourier space. This method has severe drawbacks. The better the sample approximates a point source the smaller the MFM-signal will be. This severely limits the accuracy of the calibration, due to the small signal-to-noise ratio of the measurement. Moreover, point source samples are difficult to produce. Their spatial extent limits the accuracy to which the impulse response function can be determined. For repeated calibrations repeated positioning of the point source sample is necessary.

Principles of operation of MFMs are shown in the article of D. Rugar et al., "Magnetic force microscopy: General principles and applications to longitudinal recording media", Journal of Applied Physics, Vol. 68 (3), P. 1169–1183 (1990). The MFM response is analyzed in direct space by modelling the tip geometry and cantilever tilt. However, the geometric tip model is complicated and of limited value since four fitting parameters are used.

Another tip calibration technique is presented in the article of L. Kong et al., "Quantification of magnetic force microscopy using a micronscale current ring", Applied Physics Letters Vol. 70 (15), p. 2043–2045 (1997). A controlled magnetic field of a ring conductor with 1 $\mu$m–5 $\mu$m diameter is probed by the tip. The resulting MFM-signal is interpreted in terms of a magnetic monopole and dipole strength of the tip. Again a tip model is required to quantify magnetic properties of the tip.

Principles of operation of Scanning Hall probe microscopes (SHPM) are shown in the article of A. Oral et al., "Real-time scanning Hall probe microscopy", Applied Physics Letters Vol. 69 (9), p. 1324–1326 (1996). A tip comprising a submicron Hall probe manufactured in a GaAs heterostructure is scanned over the sample to measure the magnetic stray field using conventional scanning tunneling microscopy positioning techniques. However, the magnetic field sensitivity decreases on the length scale of the Hall probe tip and requires calibration for absolute stray field measurements.

BRIEF SUMMARY OF THE INVENTION

Hence, it is a general object of the invention to provide a simplified and improved calibration method for magnetic force microscopes (MFM) and scanning Hall probe microscopes (SHPM). Now, in order to implement these and still further objects of the invention, which will become more readily apparent as the description proceeds, the calibration method comprises the steps of providing a sample with an irregular sample magnetization pattern M or an irregular current distribution over an extended area, determining, based on the raw MFM- or SHPM-image S of the sample, an approximate sample magnetization pattern $M_0$ and therefrom an approximate sample magnetic stray field distribution $H_0$, and calculating the instrument response function IRF from the raw MFM- or SHPM-image S and the approximate sample magnetic stray field distribution $H_0$.

Thus one aspect of the invention resides in a method for calibrating a magnetic force microscope or a scanning Hall probe microscope, wherein raw MFM- or SHPM-images of a sample producing an arbitrary magnetic stray field are measured, the sample magnetization or current distribution patterns are estimated, the corresponding magnetic stray fields are calculated and, from the raw MFM- or SHPM-images and the magnetic stray fields, an instrument response function IRF is determined. The instrument response function IRF contains information on the magnetic stray field distribution of the tip and the tilt and mechanical behaviour of the cantilever.

By using a calibrated tip the magnitude and distribution of magnetic stray fields of arbitrary samples can be determined. Through this, also the magnetization or current distribution in the samples can be found.

The method according to invention allows to measure rather than to model the instrument response. The magnetic stray field distribution or sensitivity of the tip is determined with high precision and without restriction to magnetic monopole or dipole models. The need for preparing samples with a specific pattern of magnetic field sources is eliminated.

In another aspect of the invention the calibration method comprises the steps of determining, based on the raw MFM- or SHPM-image S, an approximate sample magnetization pattern $M_0$ and therefrom an approximate sample magnetic stray field distribution $H_0$, calculating Fourier space distributions of the raw MFM- or SHPM-image $S(\underline{k})$ and of the approximate sample magnetic stray field distribution $H_0(\underline{k})$, and calculating an instrument response function $IRF(\underline{k})=S(\underline{k})/H_0(\underline{k})$. The instrument response function IRF is thus calculated by deconvolution in Fourier space of the raw MFM- or SHPM-image with the magnetic stray field.

In a further aspect of the invention the calibration method comprises the steps of: a) measuring a plurality of raw MFM or SHPM-images $S_i$ (i=1 . . . n), b) determining first approximate sample magnetization patterns $M_{i,0}$ and first approximate sample magnetic stray field distributions $H_{i,0}$, and c) calculating from $S_i$ and $H_{i,0}$ first approximate instrument response functions $IRF_{i,0}$ and averaging them to form an initial instrument response function $IRF_0$. Thus a plurality of MFM- or SHPM-images is measured and the average of their instrument response functions delivers an improved instrument response function $IRF_0$.

In one embodiment the preceding steps b) and c) are reiterated by using a (j−1)-th instrument response function $IRF_{j-1}$ to recalculate magnetization patterns $M_{i,j}$, magnetic stray field distributions $H_{i,j}$ and a j-th instrument response function $IRF_j$ (j=1 . . . m). In other words, based on the averaged instrument response function $IRF_0$, an iterative calculation of approximate sample magnetization patterns, approximate sample magnetic stray field distributions and improved averaged instrument response functions $IRF_j$ (j=1 ... m) is performed. With an increasing number of iterations j the instrument response functions $IRF_j$ converge towards a "true" instrument response function.

Other embodiments refer to choosing samples with magnetization vectors oriented perpendicular to a sample surface to be scanned, to replacing the sample magnetic stray field distribution H by its derivative $H_{,z}$ in case of dynamic measurements, and to applying the calibration method to measure absolute values of magnetic stray fields H, magnetization patterns M or microscopic current distributions.

In further embodiments a tip calibration function $q_{tip}$, characterizing the magnetic stray field distribution of the tip of a magnetic force microscope, is derived from the instrument response function IRF. The tip calibration function $q_{tip}$ is useful to characterize the response of integrated circuits, magnetic reading heads, Hall sensors or SQUIDS to local magnetic fields or even to generate absolute microscopic magnetic gauging fields.

BRIEF DESCRIPTION OF THE DRAWINGS

The invention will be better understood and objects other than those set forth above will become apparent when consideration is given to the following detailed description thereof. Such description makes reference to the annexed drawing, wherein.

DETAILED DESCRIPTION OF THE INVENTION

Figure 1:
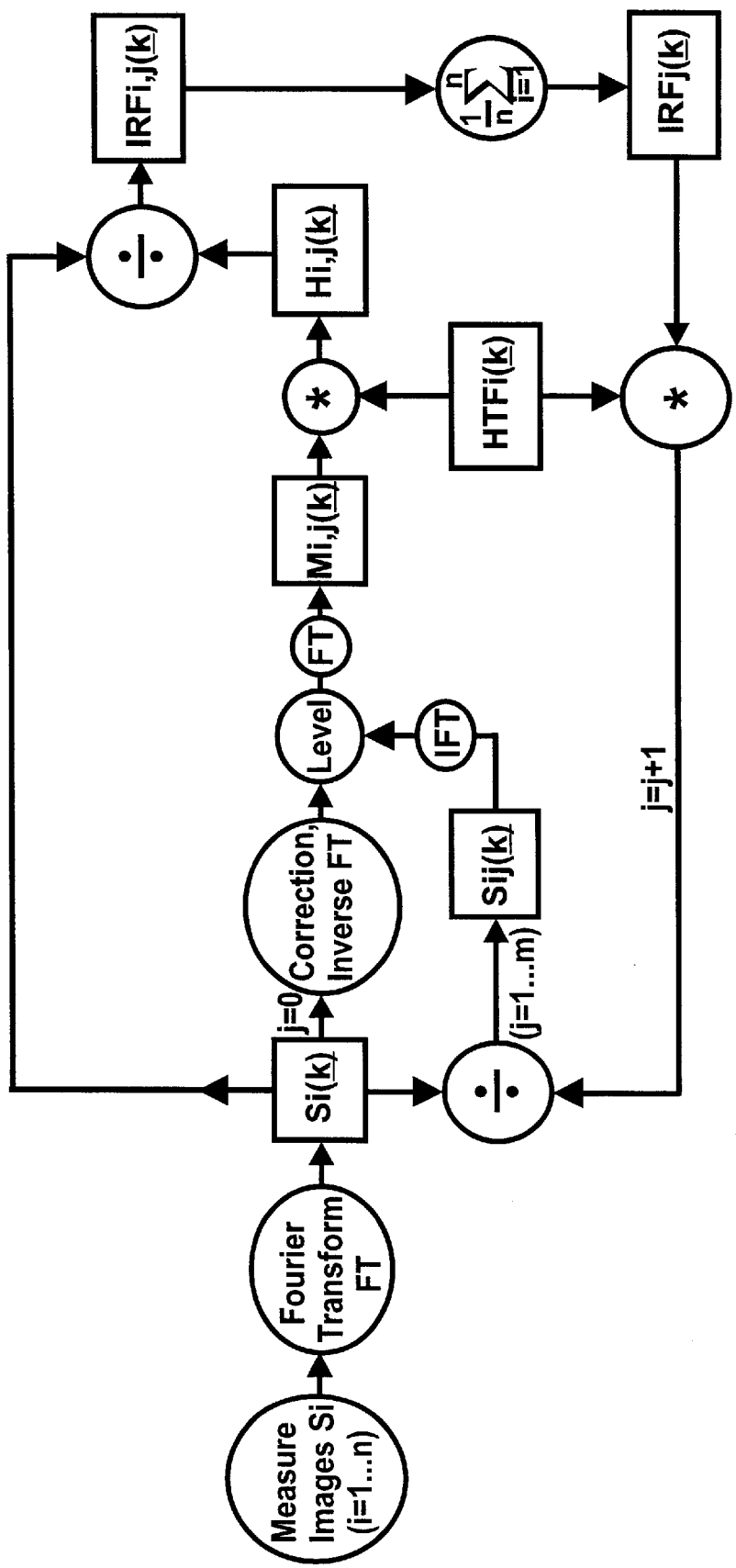
FIG. 1 shows a block diagram of the iterative calculation procedure to determine an improved averaged instrument response function $IRF_j$.

The invention refers to a method for calibrating a magnetic force microscope (MFM) or a scanning Hall probe microscope (SHPM). The MFM or SHPM comprises a small cantilever with a microscopic tip that is movable laterally above a sample surface. In the MFM the tip consists of or is coated with a ferromagnetic material. In the SHPM the tip consists of or comprises a microscopic Hall sensor. In the MFM the magnetic interaction between the tip and sample surface leads to optically detectable cantilever deflections. In static measurements the deflections are proportional to the interaction force. In dynamic measurements the shift of the cantilever resonance frequency is proportional to the force gradient. In the SHPM the Hall-voltage caused by the average of the magnetic flux portion, that emanates from the sample and passes through the Hall-probe, is measured. By laterally scanning the sample and measuring the force, force gradient or Hall-voltage as a function of position a raw MFM- or SHPM-image S of the sample is generated. An instrument response function IRF shall be provided in order to determine from the raw MFM- or SHPM-image S an improved or true stray field distribution of the sample. Thereby instrument-related features contained in the raw image S are to be compensated for.

The invention solves the problem of determining reliable instrument response functions. According to a first aspect of the invention a sample with an irregular sample magnetization pattern M over an extended area is provided. Based on the raw MFM- or SHPM-image S of the sample an approximate sample magnetization pattern $M_0$ and therefrom an approximate sample magnetic stray field distribution $H_0$ are determined. An instrument response function IRF is then calculated from the raw MFM- or SHPM-image S and the approximate magnetic stray field distribution $H_0$. The instrument response function IRF is then applicable to correcting arbitrary raw MFM- or SHPM-images. Thus it serves as a general calibrating function for the MFM or SHPM.

The irregularity of the sample magnetization pattern assures that a great variety of magnetization wavevectors in the sample surface plane are measured and accordingly the instrument response function is determined for a broad spectrum of wavevectors. The sample magnetization and magnetic stray field are related to each other by physical equations, as may be seen e. g. from the article by D. Rugar et al. These equations shall be applied to the specific sample under investigation. In the case of calculations in Fourier space the relationship between magnetization and stray field can be described by a multiplicative field transfer function $HTF(\underline{k})$, as shown in the article by H. J. Hug et al., "Quantitative magnetic force microscopy on perpendicularly magnetized samples", Journal of Applied Physics Vol. 83 (11), p. 5609–5620 (1998).

In a preferred embodiment the instrument response function IRF is calculated from S and $H_0$ by a deconvolution in Fourier space, by a Wiener filtering (W. H. Press, B. P. Flannery and S. A. Tenkolsky, "Numerical recipes in Pascal", paragraph 12.6, Cambridge University Press, Cambridge (1989)), by a conjugate gradient method (R. J. Griessen, "Fast determination of 2D current patterns in flat conductors from measurement of their magnetic field", Physica C 295, 177 (1998) or M. Hestenes, "Conjugate direction methods in Optimization", Springer Verlag, New York (1980)), or by a maximum entropy method (N. Wu, "The maximum entropy method", Springer Verlag, Berlin (1997)).

A second aspect of the calibration method consists in that, based on the raw MFM- or SHPM-image S, an approximate sample magnetization pattern $M_0$ and therefrom an approximate magnetic stray field distribution $H_0$ are determined, the Fourier space distributions of the raw MFM- or SHPM-image $S(\underline{k})$ and of the approximate magnetic stray field distribution $H_0(\underline{k})$ are calculated and an instrument response function $IRF(\underline{k})$ is calculated according to the equation $IRF(\underline{k})=S(\underline{k})/H_0(\underline{k})$. By calculating in Fourier rather than direct space complicated deconvolution integrals can be replaced by simple divisions.

Advantageously a sample with a magnetization vector $\underline{M}$ having constant magnitude and two distinct orientations is provided and an approximate sample magnetization pattern $M_0$ is estimated by converting the raw MFM- or SHPM-image S into a binary pattern. This conversion may be done by applying a discrimination level to the raw image S or by using any standard image processing technique to segment or binarize grey scale images. Such techniques are discussed e. g. in E. L. Hall, "Computer Image Processing and Recognition", Academic Press (1982). By choosing a sample with a binary magnetization pattern the pattern may be reproduced or at least be approximated by binarization of the measured magnetic stray field. Preferentially the sample magnetization vector $\underline{M}$ is aligned perpendicularly to the scanned sample surface and flips between up- and down-orientation at magnetic domain walls. In such samples there exists an unambiguous relation between the sample magnetization pattern and the thereby induced magnetic stray field. Such samples are easy to produce and are readily available.

In a another embodiment an improved instrument response function $IRF_0$ is calculated by measuring several different MFM- or SHPM-images $S_i$ and averaging their instrument response functions IRF($\underline{k}$). In particular, based on the averaged instrument response function $IRF_0$, an iterative calculation of approximate sample magnetization patterns, approximate magnetic stray field distributions and averaged instrument response functions $IRF_j$ (j=1 ... m) is performed. A possible calculation scheme is exemplified in FIG. 1.

A third aspect of the calibration method consists in that a plurality of raw MFM- or SHPM-images $S_i$ (i=1 ... n), preferentially of different samples or sample areas, is measured, first approximate sample magnetization patterns $M_{i,0}$ and first approximate sample magnetic stray field distributions $H_{i,0}$ are determined, and from $S_i$ and $H_{i,0}$ first approximate instrument response functions $IRF_{i,0}$ are calculated and averaged to form an initial instrument response function $IRF_0$. Through this procedure an improved instrument response function $IRF_0$ is derived. For further improvements the calculation procedure is reiterated by using a (j−1)-th instrument response function $IRF_{j-1}$ to recalculate magnetization patterns $M_{i,j}$, magnetic stray field distributions $H_{i,j}$ and a j-th instrument response function $IRF_j$ (j=1 ... m). Again the deconvolution of the raw images $S_i$ with the approximate magnetic stray field distributions $H_{i,j}$ yielding the instrument response functions $IRF_{i,j}$ may be done by division in Fourier space, by Wiener filtering or by a conjugate gradient or maximum entropy method.

This third aspect is shown in FIG. 1 for the case of performing calculations in Fourier space. The measured raw MFM- or SHPM-images $S_i$ are Fourier transformed into $S_i(\underline{k})$. The $S_i(\underline{k})$ may be corrected, e. g. for the effects of tip canting, are inverse Fourier transformed and binarized by applying a discrimination level. After Fourier transformation the approximate magnetization patterns $M_{i,j}(\underline{k})$ are found. They are multiplied with the field transfer functions $HTF_i(\underline{k})$ to form the approximate magnetic stray field functions $H_{i,j}(\underline{k})$. The field transfer functions $HTF_i(\underline{k})$ may depend on the image index i, if the imaged samples or sample areas contain magnetization vectors $\underline{M}$ of different orientation, if the samples have different thicknesses, or if the measurements are performed at different distances between sample and tip. By dividing the raw Fourier transformed MFM- or SHPM-images $S_i(\underline{k})$ by the corresponding magnetic stray field functions $H_{i,j}(\underline{k})$ the impulse response functions $IRF_{i,j}(\underline{k})$ as a function of wavevector $\underline{k}$ are found. Their arithmetical mean $IRF_j(\underline{k})$ multiplied by the field transfer function $HTF_i(\underline{k})$ serves for deconvolving the $S_i(\underline{k})$. Note that j is incremented by 1 in this step. The deconvolved images $S_{i,j}(\underline{k})$ may then restart the process of inverse Fourier transformation, binarization, Fourier transformation, multiplication with $HTF_i(\underline{k})$, division $S_i(\underline{k})/H_{i,j}(\underline{k})$, formation of an improved average impulse response $IRF_j$ and again deconvolution of $S_i(\underline{k})$. In practical experiments it was shown that already few images (n=4 ... 5) and few iterations (j=3 ... 4) are sufficient to produce reliable instrument response functions $IRF_j(\underline{k})$. Simulated MFM-images based on these $IRF_j(\underline{k})$ deliver excellent reproductions of measured MFM-images and outperform by far simplifying monopole or dipole models of the MFM-tip.

It is desirable that the sample magnetization pattern M contains a sufficiently broad two-dimensional Fourier spectrum and a sufficient area in order to characterize the instrument response function IRF with a predefined precision. In particular, the sample magnetization pattern shall also contain features of a size comparable to or smaller than the spatial variations of the tip magnetic stray field (in MFN) or tip magnetic field sensitivity (in SHPM) that is to be calibrated. As an alternative requirement the magnetization pattern of the calibration sample shall have a Fourier spectrum at least as broad as the samples to be measured.

Preferentially the above calculation is done for sample magnetization vectors $\underline{M}$ oriented perpendicularly to the scanned sample surface. Then the field transfer function $HTF_i(\underline{k})$ is well-known and the stray field calculation is straightforward and precise. In general the sample may also contain a current distribution instead of a magnetization pattern M. Furthermore, in the case of dynamic measurements with MFMs, the raw MFM-images $S_i$ depend on the force gradient rather than the force itself, the magnetic stray field distribution H may be replaced by its derivative $H_z$ with respect to the z-direction normal to the sample surface and in FIG. 1 the field transfer function $HTF_i(\underline{k})$ shall be replaced by $k \cdot HTF_i(\underline{k})$.

Another embodiment of the invention aims at eliminating the influence of a cantilever tilt on the MFM- or SHPM-images $S_i$.

For this purpose a lever canting function $LCF(\underline{k})$ is introduced, that relates the measured force or magnetic flux to the force component or magnetic flux component in a direction perpendicular to the sample surface. The images $S_i$ shall be deconvolved with $LCF^\beta(\underline{k})$, where the value of $\beta$ depends on whether the force or magnetic flux ($\beta$=1) or the force gradient ($\beta$=2) is measured. The lever canting function $LCF(\underline{k})$ can be calculated according to the equation $LCF(\underline{k}) = \underline{n} \cdot \underline{\nabla}/k$, where $\underline{n}$=direction vector normal to the cantilever axis, $\underline{\nabla}=(ik_x,ik_y,-k)$=gradient in Fourier space and $k_x,k_y$=in-plane coordinates and k=magnitude of the wavevector $\underline{k}$. By deconvolving the images $S_i$ with $LCF^\beta(\underline{k})$ images with considerably less distortion of the imaged magnetic structures are produced.

A further important embodiment for the MFM consists in that a tip calibration function $q_{tip}(\underline{k})$, characterizing the magnetic stray field distribution of the tip of a magnetic force microscope, is derived from the instrument response function IRF, $IRF_0$ or $IRF_j$ (j=1 ... m). This can be done by calculating a tip calibration function $q_{tip}(\underline{k})$ according to the equation $q_{tip}(\underline{k})=IRF(\underline{k})/(LCF^\beta(\underline{k}) \cdot CC)$ with $\beta$=1 or $\beta$=2, where LCF=lever canting function and the constant CC describes the mechanical properties of the cantilever. In the following examples for calculating $q_{tip}(\underline{k})$ are given for four different kinds of instrument response functions: (i) $IRF_{z/Hz}(\underline{k})$ relating stray field $H_z$ to cantilever deflection z: $\beta$=1 and $CC=c_L^{-1}$; (ii) $IRF_{df/dHz}(\underline{k})$ relating stray field derivative $dH_z$ to resonance frequency shift df: $\beta$=2 and $CC=-(f_o/2 \cdot c_L)$; (iii) $IRF_{df/Hz}(\underline{k})$ relating stray field $H_z$ to resonance frequency shift df: $\beta$=2 and $CC=(f_o \cdot k/2 \cdot c_L)$; and (iv) $IRF_{dp/Hz}(\underline{k})$ relating stray field $H_z$ to phase shift dp between the excitation of the cantilever and the deflection signal: $\beta$=2 and $CC=(Q/c_L)$, where $f_0$=resonance frequency, $c_L$=force constant and Q=quality factor of the free cantilever.

Important applications of the method according to invention are given in the following. The instrument response function IRF, $IRF_0$, $IRF_j$ allows to calibrate magnetic force or scanning Hall probe microscopes, e. g. repeatedly before and after measurements. The tip calibration function $q_{tip}(\underline{k})$ allows to magnetically characterize tips of magnetic force microscopes and in particular to determine their three-dimensional magnetic stray field distribution. Consequently, precisely calibrated tips may be produced. Furthermore, with the help of the instrument response function $IRF(\underline{k})$, $IRF_0(\underline{k})$, $IRF_j(\underline{k})$ absolute values of magnetic stray fields H, magnetization patterns M or microscopic current distributions may be measured. With the help of the tip calibration function $q_{tip}(\underline{k})$ absolute microscopic magnetic gauging fields may be generated. In particular, the tip calibration function $q_{tip}(\underline{k})$ is useful to characterize the response of integrated circuits, magnetic reading heads, Hall sensors or SQUIDS to a local magnetic field through scanning a tip with known stray field over these samples or sensors.

While there are shown and described presently preferred embodiments of the invention, it is to be distinctly understood that the invention is not limited thereto but may be otherwise variously embodied and practised within the scope of the following claims.

What is claimed is:

1. A method for calibrating a magnetic force microscope (MFM) or a scanning Hall probe microscope (SHPM), wherein a raw MFM- or SHPM-image S is measured by scanning a sample with a microscopic tip and an instrument response function IRF is determined for calibrating the MFM or SHPM, comprising the steps of
   a) providing the sample with an irregular sample magnetization pattern M or an irregular current distribution over an extended area,
   b) determining, based on the raw MFM- or SHPM-image S of the sample, an approximate sample magnetization pattern $M_0$ and therefrom an approximate sample magnetic stray field distribution $H_0$ and
   c) calculating the instrument response function IRF from the raw MFM- or SHPM-image S and the approximate sample magnetic stray field distribution $H_0$.

2. The method according to claim 1, wherein the instrument response function IRF is calculated by a deconvolution in Fourier space, by a Wiener filtering, by a conjugate gradient method or by a maximum entropy method.

3. The method according to claim 1, comprising the steps of
   a) providing a sample with a magnetization vector $\underline{M}$ having constant magnitude and two distinct orientations and
   b) estimating an approximate sample magnetization pattern $M_0$ by converting the raw MFM- or SHPM-image S into a binary pattern.

4. The method according to claim 1, wherein the sample magnetization vector is oriented perpendicularly to a sample surface being scanned.

5. The method according to claim 1, comprising the step of calculating an improved instrument response function $IRF_0$ by measuring several MFM- or SHPM-images $S_i$ and averaging their instrument response functions $IRF(\underline{k})$.

6. The method according to claim 5, comprising the steps of performing, based on the averaged instrument response function $IRF_0$, iterative calculations of approximate sample magnetization patterns, approximate sample magnetic stray field distributions and averaged instrument response functions $IRF_j$ (j=1 ... m).

7. The method according to claim 1, wherein the sample magnetic stray field distribution H is replaced by its derivative $H_z$ in case of dynamic measurements.

8. The method according to claim 1, wherein a tip calibration function $q_{tip}(\underline{k})$, characterizing the magnetic stray field distribution of the tip of the magnetic force microscope (MFM), is derived from the instrument response function IRF, $IRF_0$ or $IRF_j$ (j=1 ... m).

9. The method according to claim 8, comprising the step of calculating a tip calibration function $q_{tip}(\underline{k})$ according to the equation $q_{tip}(\underline{k}) = IRF(\underline{k})/(LCF^\beta(\underline{k})*CC)$ with $\beta=1$ or $\beta=2$, where the lever canting function LCF describes the effects of a cantilever tilt with respect to the sample surface and the constant CC describes the mechanical properties of the cantilever.

10. The method according to claim 9, comprising the step of calculating a lever canting function $LCF(\underline{k})$ according to the equation $LCF(\underline{k}) = \underline{n}\cdot\underline{\nabla}/k$, where $\underline{n}$=direction vector normal to the cantilever axis, $\underline{\nabla}=(ik_x, ik_y, -k)$=gradient in Fourier space and $k_x, k_y$=in-plane coordinates and k=magnitude of a wavevector.

11. The method according to claim 10, wherein
   a) the tip calibration function $q_{tip}(\underline{k})$ is used to generate absolute microscopic magnetic gauging fields and/or
   b) the tip calibration function $q_{tip}(\underline{k})$ is used to characterize the response of integrated circuits, magnetic reading heads, Hall sensors or SQUIDS to a local magnetic field.

12. The method according to claim 9, wherein
   a) the tip calibration function $q_{tip}(\underline{k})$ is used to generate absolute microscopic magnetic gauging fields and/or
   b) the tip calibration function $q_{tip}(\underline{k})$ is used to characterize the response of integrated circuits, magnetic reading heads, Hall sensors or SQUIDS to a local magnetic field.

13. The method according to claim 8, wherein the sample magnetic stray field distribution H is replaced by its derivative $H_z$ in case of dynamic measurements.

14. The method according to claim 8, wherein
   a) the tip calibration function $q_{tip}(\underline{k})$ is used to generate absolute microscopic magnetic gauging fields and/or
   b) the tip calibration function $q_{tip}(\underline{k})$ is used to characterize the response of integrated circuits, magnetic reading heads, Hall sensors or SQUIDS to a local magnetic field.

15. The method according to claim 1, wherein the instrument response function $IRF(\underline{k})$, $IRF_0(\underline{k})$, $IRF_j(\underline{k})$ is used to measure absolute values of magnetic stray fields H, magnetization patterns M or microscopic current distributions.

16. A method for calibrating a magnetic force microscope (MFM) or a scanning Hall probe microscope (SHPM), wherein a raw MFM- oder SHPM-image S is measured by scanning a sample with a microscopic tip and an instrument response function IRF is determined for calibrating the MFM or SHPM, comprising the steps of
   a) determining, based on the raw MFM- or SHPM-image S, an approximate sample magnetization pattern $M_0$ and there-from an approximate sample magnetic stray field distribution $H_0$,
   b) calculating Fourier space distributions of the raw MFM- or SHPM-image $S(\underline{k})$ and of the approximate sample magnetic stray field distribution $H_0(\underline{k})$ and
   c) calculating an instrument response function $IRF(\underline{k})=S(\underline{k})/H_0(\underline{k})$.

17. The method according to claim 16, comprising the step of providing a sample with an irregular sample magnetization pattern M or an irregular current distribution over an extended area.

18. The method according to claim 16, comprising the steps of
   c) providing a sample with a magnetization vector $\underline{M}$ having constant magnitude and two distinct orientations and
   d) estimating an approximate sample magnetization pattern $M_0$ by converting the raw MFM- or SHPM-image S into a binary pattern.

19. The method according to claim 18, wherein the sample magnetization vector is oriented perpendicularly to a sample surface being scanned.

20. A method for calibrating a magnetic force microscope (MFM) or a scanning Hall probe microscope (SHPM), wherein a raw MFM- oder SHPM-image S is measured by scanning a sample with a microscopic tip and an instrument response function IRF is determined for calibrating the MFM or SHPM, comprising the steps of a) measuring a plurality of raw MFM- or SHPM-images $S_i(i=1 \ldots n)$,
b) determining first approximate sample magnetization patterns $M_{i,0}$ and first approximate sample magnetic stray field distributions $H_{i,0}$ and
c) calculating from $S_i$ and $H_{i,0}$ first approximate instrument response functions $IRF_{i,0}$ and averaging them to form an instrument response function $IRF_0$.

21. The method according to claim 20, comprising the step of reiterating the preceding steps b) and c) by using a (j-1)-th instrument response function $IRF_{j-1}$ to recalculate magnetization patterns $M_{i,j}$, magnetic stray field distributions $H_{i,j}$ and a j-th instrument response function $IRF_j$ (j=1 ... m).

22. The method according to claim 21, wherein the sample magnetization pattern M contains a sufficiently broad two-dimensional Fourier spectrum and a sufficient area in order to characterize the instrument response function IRF with a predefined precision.

23. The method according to claim 20, wherein the sample magnetization pattern M contains a sufficiently broad two-dimensional Fourier spectrum and a sufficient area in order to characterize the instrument response function IRF with a predefined precision.

24. The method according to claim 20, wherein the sample contains a current distribution instead of a magnetization pattern M.

25. The method according to claim 20, wherein the sample magnetization vector is oriented perpendicularly to a sample surface being scanned.

* * * * *